United States Patent [19]

Asada et al.

[11] 4,080,577

[45] Mar. 21, 1978

[54] SEMICONDUCTOR INTEGRATED CIRCUIT

[75] Inventors: Katsuhiko Asada, Amagasaki; Takao Nakano; Kenji Murakami, both of Itami, all of Japan

[73] Assignee: Mitsubishi Denki Kabushiki Kaisha, Japan

[21] Appl. No.: 613,505

[22] Filed: Sep. 15, 1975

[30] Foreign Application Priority Data

Sep. 20, 1974 Japan ................................ 49-109305

[51] Int. Cl.$^2$ ............................................. H03F 3/14
[52] U.S. Cl. ................................... 330/307; 307/303; 330/290; 330/293
[58] Field of Search ................. 330/18, 22, 25, 38 M, 330/40, 85; 307/303, 300; 357/37

[56] References Cited

U.S. PATENT DOCUMENTS 3,890,634  6/1975  Ruegg ............................ 307/303 X Primary Examiner—James B. Mullins
Attorney, Agent, or Firm—Robert E. Burns; Emmanuel J. Lobato; Bruce L. Adams

[57] ABSTRACT

The disclosed linear amplifier comprises a grounded N+ semiconductor substrate on which an N layer is epitaxially grown. The N epitaxial layer includes three separate P diffusion regions. One of the outermost regions is connected to an input terminal and includes an N diffusion region to form an input, common emitter NPN transistor with the epitaxial layer while forming a feedback, common base PNP transistor with the intermediate P diffusion region and epitaxial layer. The remaining P region forms a load, common base PNP transistor with the intermediate P region and epitaxial layer and is connected to an injector terminal. The intermediate P region and N region are connected to an output terminal.

9 Claims, 7 Drawing Figures

SEMICONDUCTOR INTEGRATED CIRCUIT

BACKGROUND OF THE INVENTION

This invention relates to a structure of a semiconductor integrated circuit forming a linear amplifier circuit with an integrated injection logic (which is abbreviated hereinafter to "IIL") configuration.

Heretofore MOS-FET systems have been principally employed to produce semicoductor integrated circuits having high density-large scale integrations. As will be well known, the MOS-FET systems have eliminated the necessity of separating semiconductor elements involved from one another and been less in the number of the manufacturing steps resulting in simple structures. Recently, there has been proposed the IIL configuration comprising, for example, a lateral common base PNP transistor including a base and a collector region respectively occupying the same regions of a semiconductive body as an emitter and a base region of a longitudinal, common emitter NPN transistor resulting in a composite, simplified structure. Although the IIL configuration is of a bipolar system, it also eliminates the necessity of separating semiconductor elements involved from one another and is comparable with the MOS-FET system in both a small number of the manufacture steps and the simplicity of the structure. Further the IIL configuration stubbornly utilizes a junction disposed within the particular semiconductive body whereas the MOS-FET system is operative by controlling the surface of the particular semiconductive body by gates involved. Thus the IIL configuration can avoid the difficult problems concerning the surface of the semiconductive body and accordingly it is regarded to be promising as means for producing high density-large scale integrated circuits in accordance with the bipolar system.

SUMMARY OF THE INVENTION

Accordingly it is an object of the present invention to provide a new and improved structure of a semiconductor integrated circuit having an IIL configuration.

It is another object of the present invention to provide a new and improved structure of a semiconductor integrated circuit forming a linear amplifier circuit by using an IIL configuration.

It is still another object of the present invention to provide a new and improved structure of a semiconductor integrated circuit forming a linear amplifier circuit with a high gain of active elements alone without any ohmic resistance elements used.

It is a further object of the present invention to provide a new and improved structure of a semiconductor integrated circuit extremely improved in density of integration.

It is another object of the present invention to provide a new and improved structure of a semiconductor integrate circuit realizing the excellent characteristics features as above described without the number of the manufacturing steps increased.

The present invention accomplishes these objects by the provision of a semiconductor integrated circuit having a composite structure comprising a longitudinal, common emitter NPN transistor including an emitter region and a base region common to aa base region and a collector region of a lateral, common base PNP transistor respectively, and an input terminal connected to a P type region common to the base region of the NPN transistor and the collector region of the PNP transistor, the NPN transistor including a collector region connected to an output terminal, wherein the PNP transistor includes an emitter region formed of another P type region, the last-mentioned P type region forming a collector region of a load, lateral, common base PNP transistor and being connected to the output terminal, and the load lateral common base PNP transistor includes an emitter region connected to an injector terminal.

In a preferred embodiment of the present invention the semiconductor integrated circuit may comprise an injector terminal, a load, common base PNP transistor including a collector region and an emitter region connected to the injector terminal and responsive to carriers from the injector terminal injected into the emitter region to be conducting and operative as a source of constant current, an input, common emitter NPN transistor including a collector region common to the collector region of the load PNP transistor and a base region connected to an input terminal, and an emitter region, and a feedback, common base PNP transistor including a base region and a collector region common to the emitter and base regions of the input NPN transistor respectively to form an IIL configuration with the input transistor, the feedback PNP transistor including an emitter region connected to an output terminal, the output terminal being also connected to the collector regions of the load and input transistors whereby an input signal applied to the input signal is linearly amplifier and developed at the output terminal.

BRIEF DESCRIPTION OF THE DRAWINGS

The present invention will become more readily apparent from the following detailed description taken in conjunction with the accompanying drawings in which.

Throughout the Figures like reference numerals designate the identical or corresponding components.

DESCRIPTION OF THE PREFERRED EMBODIMENTS

Figure 1:
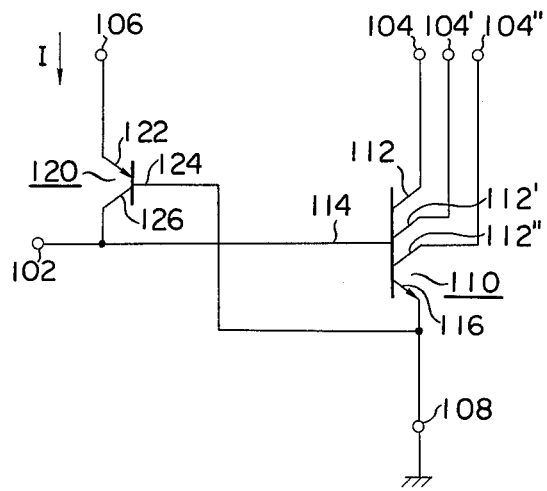
FIG. 1 is a circuit diagram of an inverter circuit having an IIL configuration on which the present invention is based.

Referring now to the drawings and FIG. 1 in particular, there is illustrated an inverter circuit which is one of the fundamental elements of the convetional IIL configuration. The arrangement illustrated comprises a longitudinal, common emitter NPN transistor 110 including a plurality, in this case, three of collector regions 112, 112' and 112", a base region 114 and an emitter region 116, and a lateral, common base PNP transistor 120 including an emitter region 122, a base region 124 and a collector region 126. The base region 124 of the NPN transistor 110 is connected to both the collector region 126 of the PNP transistor 120 and an input terminal 102 while the collector regions 112, 112' and 112" thereof are connected to output terminals 104, 104' and 104" respectively. An injector terminal 106 is connected to the emitter region 122 of the PNP transistor 120 and a ground terminal 108 is connected to both the emitter region 116 of the NPN transistor 110 and the base region 124 of the PNP transistor. 120. The NPN transistor 110 performs the amplifying operation and is supplied with a base current having a constant magnitude from the PNP trnsistor 120 whereby a direct current applied to the input terminal 101 is developed, as a corresponding alternating current, at ech of the output terminals 104, 104' and 104". Thus the arrangement of FIG. 1 forms an inverter circuit.

Figure 2:
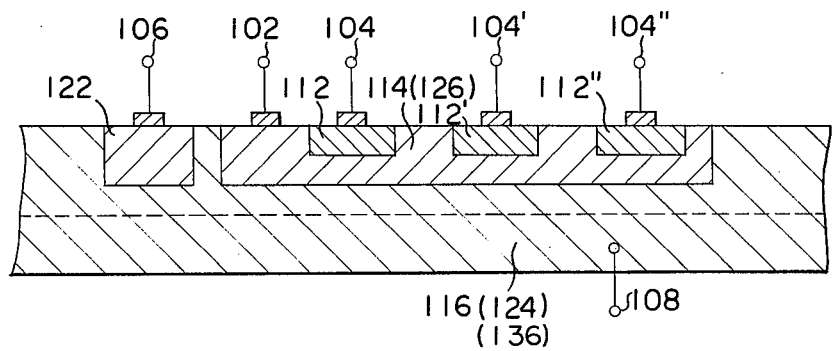
FIG. 2 is a fragmental sectional view of a conventional structure of the arrangement shown in FIG. 1.

As shown in FIG. 2, the emitter region 116 of the NPN transistor 110 and the base region 124 of the PNP transistor 120 are formed of a common region of a semiconductor substrate while the base region 114 of the NPN transistor 110 and the collector region 126 of the PNP transistor 120 are formed of another common region of the substrate. Further the collector regions 112, 112' and 112" are disposed in space relationship within the region common to the base and collector regions 114 and 126 respectively of the NPN and PNP transistor 110 and 120. The emitter region 122 of the PNP transistor 120 is spaced away from the common region 114(126) by a predetermined length less than a diffusion length of carriers.

The input terminal 102 and the output terminals 104, 104' and 104" are connected to respective electrodes disposed in ohmic contact with the common region serving as the base region 114 of the NPN transistor 110 and the collector region 126 of the PNP transistor 120 and the collector regions 112, 112' and 112" of the NPN transistor 110. The injector terminal 106 is connected to an electrode disposed in ohmic contact with the emitter region 122 of the NPN transistor 120 and the ground terminal 108 is connected to the common region serving as the emitter region 116 of the NPN transistor 110 and the collector region 124 of the PNP transistor 120.

Therefore the arrangement of FIG. 1 has a composite simplified structure.

In operation the injector terminal 106 connected to a source of direct current (not shown) is biased to be positive with respect to the ground terminal 108 by a magnitude equal to a diffusion potential at a PN junction disposed in the PNP transistor 120. This causes the injection of a current I (see FIG. 1) from the emitter region 122 of the PNP transistor 120 into the base region 124 thereof resulting in the condition of the PNP transistor 120. At that time, it is assumed that the input terminal 102 is at an "H" level. Then the PNP transistor 120 is brought into its saturated state in which that portion of carriers injected from the emitter region 122 and collected by the base region 124 supplies a base current to the NPN transistor 110. Thus the NPN transistor 110 is turned on until it is saturated.

Under these circumstances, each of the output terminals 104, 104' and 104" or the collector regions 112, 112' and 112" of the NPN transistor 110 is at a potential equal to a saturation voltage across the associated collector region and the emitter region of that transistor. That is, the collector regions 112, 112' and 112" or the output terminals 104, 104' and 104" are at an "L" level. Thus the inversion logic is held between the input and outputs.

On the other hand, if the input terminal 102 is at an "L" level then a current flowing through the PNP transistor 120 flows into the input terminal 102 to put the NPN transistor 110 in its non-conducting state in which the output terminals 104, 104' and 104" or the collector regions 112, 112" and 112" of the transistor 110 are at an "H" level. Therefore the inversion logic is also held between the input and the outputs.

In the arrangement of FIG. 2, the carriers in the PNP transistor 120 is injected from its emitter region 122 into its base region 124 reach the base region 114 of the NPN transistor 110 positioned within a diffusion length of carriers from the emitter region 122 of the PNP transistor 120 because of the carrier diffusion type. However those carriers can not reach another adjacent transistor or transistors (not shown) disposed beyond the diffusion length of carriers from the emitter region 122. Therefore the arrangement of FIG. 2 eliminates the necessity of disposing a separation region or regions for another adjacent transistor or transistors.

It is also to be noted that only two diffusion steps are required to form the various regions of the arrangement as shown in FIG. 2. This means that the number of the manufacturing steps is very small as compared with conventional bipolar systems resulting in a high yield.

Figure 3:
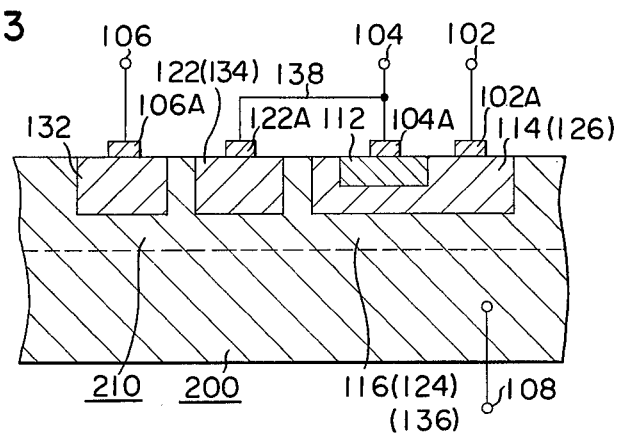
FIG. 3 is a fragmental sectional view of a structure of a semiconductor integrated circuit illustrating one embodiment of a linear amplifier circuit with an IIL configuration constructed in accordance with the principles of the present invention.

Referring now to FIG. 3 there is illustrated a structure of a semiconductor integrated circuit constructed in accordance with the principles of the present invention. The arrangement illustrated comprises a substrate of N$^+$ type semiconductive material generally designated by the reference numeral 200 and having a high impurity concentration of from $10^{17}$ to $10^{18}$ atoms per cubic centimeter and an epitaxial N type semiconductor layer grown on the N$^+$ type substrate 200 and generally designated by the reference numeral 210. The epitaxial layer 210 is formed of an N type semiconductive material having an impurity concentration of from $10^{15}$ to $10^{16}$ atoms per cubic centimeter and therefore a resistivity ranging from about 1 to 0.2 ohm-centimeter. The layer 210 serves as both the emitter region 116 of the NPN transistor 110 and the base region 124 of the PNP transistor 120.

A P type impurity such as boron is selectively diffused into predetermined portions of the exposed surface of the epitaxial layer 210 as by thermal diffusion technique to form P type regions 114, 122 and 132 at predetermined intervals less than a diffusion length of carriers. The P type region 114 has a sheet resistance of from 200 to 500 ohms per square.

Then an N type impurity such as phosphorous is selectively diffused into the P type region 114 to form an N type region 112 having a sheet resistance of about 2 ohms per square.

With the substrate 200 connected to the ground terminal 108, the N type region 112, the P type region 114 and the N type epitaxial layer 210 form the collector region 112, the base region 114 and the emitter region 116 of the longitudinal, common emitter NPN transistor 110, respectively and the P type region 122, the N type epitaxial layer 210 also designated by the reference numeral 124 and the P region 114 also designated by the reference numeral 126 form the emitter region 122, the base region 124 and the collector region 126 of the lateral, common base PNP transistor 120 respectively. Similarly the P type region 132, the N type epitaxial layer 210 also designated by the reference numeral 136 and the P type region 122 also designated by the reference numeral 134 form an emitter region 132, a base region 136 and a collector region 134 of a lateral, common base PNP transistor 130 serving a load respectively. In other words, the N type epitaxial layer 210 serves as the emitter region 116 of the NPN transistor 110, the base region 124 of the PNP transistor 120 and the base region 136 of the load PNP transistor. The P type region 114 serves as the base region 114 of the NPN transistor 110 and the collector region 126 of the PNP transistor 120. Also the P type region 122 serves as the emitter region 122 of the PNP transistor 120 and the collector region 134 of the load transistor 130.

As shown in FIG. 3, the input terminal 102 is connected to an electrode 102A disposed in ohmic contact with the region 114(126) and the output terminal 104 is connected to an electrode 104A disposed in ohmic contact with the region 112. Further the injector terminal 106 is connected to an electrode 106A disposed in ohmic contact with the region 132 while an electrode 122A is disposed in ohmic contact with the region 122(134) and connected to the electrode 104A through a lead 138.

Figure 4:
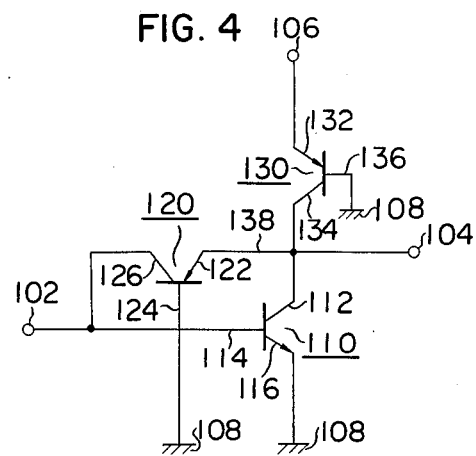
FIG. 4 is a diagram of an equivalent circuit to the arrangement shown in FIG. 3.

The arrangement of FIG. 3 has an equivalent circuit as shown in FIG. 4. From FIG. 4 it is seen that the NPN transistor 110 serves as an input transistor, the PNP transistor 130 serves as both a load resistance and a source of constant current, and the PNP transistor 120 serves as a feedback transistor.

The arrangement of FIG. 3 or the equivalent circuit of FIG. 4 is effectively operative as a linear amplifier which will subsequently be described.

When the injector terminal 106 is connected to a source of dc voltage (not shown) a base current from the source is injected through the injector terminal 106, and the emitter and base regions 132 and 136 respectively of the PNP transistor 130 into the ground terminal 107. Therefore the transistor 130 is conducting to permit a constant current to flow into the collector region 134 thereof resulting in the supply of a constant potential to the output terminal 103. That is, the transistor 110 is responsive to an input signal applied to the input terminal 102 to be controlled in amplification degree whereby the signal amplified by the transistor 110 is supplied to the output terminal 104.

In that event the transistor 120 is operative as a negative feedback transistor for maintaining a constant potential at the output terminal 104 to always supply a precise linearly amplified output to the output terminal 104.

The omission of the PNP transistor 120 from the circuit of FIG. 4 has resulted in the disadvantage that the precise linear amplification is not accomplished because a potential at the output terminal 104 much changes in accordance with the injection conditions dependent upon a variation in potential difference between the injector and ground terminals 106 and 108 respectively.

However the present invention comprises the common, base PNP transistor 120 interposed between the input and output terminals 102 and 104 respectively as shown in FIG. 4. In this measure a base current is injected into a P-N junction formed between the emitter and base regions 122 and 124 respectively of the transistor 120 which current depends upon a potential at the output terminal 104. Therefore the output from the transistor 110 is negatively feedback to the input terminal 102 through the transistor 120 to maintain the potential at the output terminal 104 constant. As a result, the circuit of FIG. 4 performs the operation of a linear amplifier circuit.

It is to be particularly noted that the present invention utilizes an IIL configuration to form the circuit of FIG. 4 into a semiconductor integrated circuit having a structure as shown in FIG. 3. More specifically, the emitter region of the input transistor 110, the base region of the negative feedback transistor 120 can be formed of a common semiconductor region and the base region of the input transistor 110 and the collector region of the negative feedback and transistor 120 can be formed of another common semiconductor region while still another common semiconductor region forms both the emitter region of the negative feedback transistor 120 and the collector region of the load transistor 130. Therefore only active elements can be used to form a linear amplifier circuit without the particular pattern dimension so large and with any ohmic resistance element never used. This can much contributes to an increase in integration density.

Further the addition of the negative feedback transistor to the semiconductor integrated circuit can be accomplished only by adding a single P type region 122 to a semiconductive body involved and indeed forming that region simultaneously with the formation of other P type regions 114 and 132 by selective diffusion technique. Thus a linear amplifier circuit having an IIL configuration can be produced by extremely simple means for modifying the particular diffusion mask without an increase in the number of the manufacturing steps.

Figure 5:
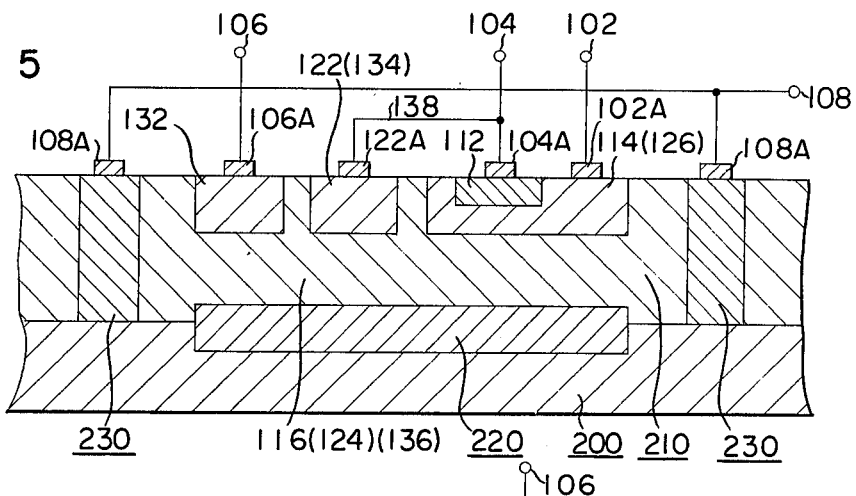
FIG. 5 is a fragmental sectional view of another structure of a semiconductor integrated circuit into which the equivalent circuit shown in FIG. 4 is constructed.

FIG. 5 shows another structure of the linear amplifier circuit as above described in conjunction with FIG. 4 formed by using the manufacturing steps employed in producing semiconductor integrated circuits of the bipolar system. In order to dispose the ground terminal on the same side of the resulting semiconductor device as all the remaining terminals, an N+ type semiconductor layer 220 is embedded in a predetermined portion of one of the main faces of the substrate 200 formed of a P type semiconductive material after which the N type semiconductor layer 210 is epitaxially grown upon the exposed surfaces of the substrate and embedded layer 220 and 220 respectively. The N+ type embedded layer 220 has such a dimension that the P type diffusion regions 132, 122(134) and 114(126) are subsequently formed in the portion of the epitaxial layer 210 just overlaid by the embedded layer 220.

After the formation of the P type regions as above described, an N+ type diffusion region 230 in the form of an annulus is formed in the epitaxial layer 210 to surround those P type regions through a predetermined annular spacing. The N+ type diffusion region 230 reaches the substrate 220. Then an annular electrode 108A is disposed in ohmic contact with the exposed surface of the N+ type diffusion region 230 as by evaporating aluminum thereon simultaneously with the formation of the electrodes 102A, 104A, 122A and 106A. The electrode 108A is connected to the ground terminal 108.

In other respects the arrangement of FIG. 5 is identical to that shown in FIG. 3. Then N+ type embedded layer 220 serves to decrease a lateral resistance of the resulting transistors.

Figure 6:
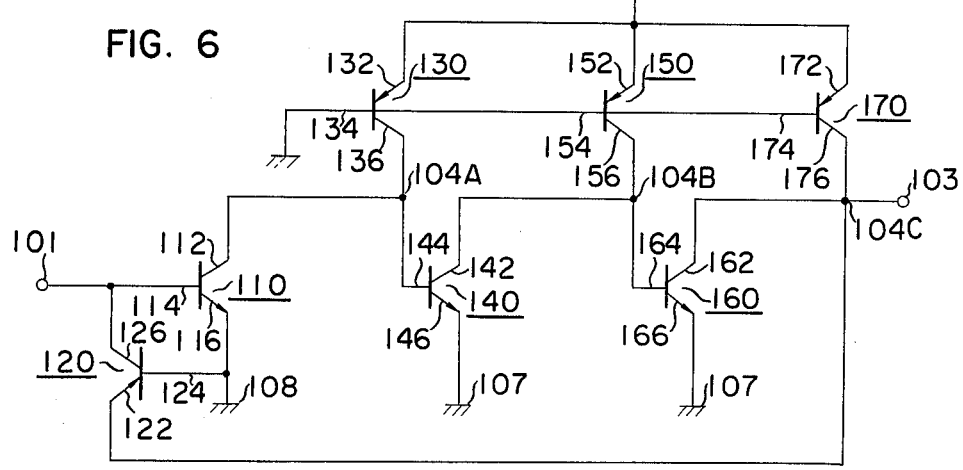
FIG. 6 is a diagram of an equivalent circuit to a linear amplifier circuit illustrating another embodiment of the present invention.

FIG. 6 shows a modification of the arrangement as shown in FIG. 4 wherein three stages of amplifiers each including an input and a combined load and constant current transistor such as the transistors 110 and 130 shown in FIG. 4 are interconnected in cascade and an output from the last stage is negatively feedback to the first stage through the feedback transistor 120. More specifically, the common base PNP transistor 130 of the first stage amplifier has its collector region 136 further connected to a base region 144 of a common emitter NPN transistor 140 through an output terminal 104A. The transistor 140 includes an emitter region 146 connected to the ground terminal 108 and a collector region 142 connected via an output terminal 104B to a collector region 156 of a common emitter PNP transistor 150 to form a second stage amplifier. The collector region 156 of the transistor 150 is also connected to a base region 164 of the common NPN transistor 160 including an emitter region 166 connected to the ground terminal 108 and a collector region 162 connected to a collector region 166 of a common base PNP transistor 170 and also to the output terminal 104. The transistor 170 includes a base region 174 connected to the base regions 154 and 134 of the transistor 150 and 130 and an emitter region 172 connected to the injector terminal 109 along with the emitter region 132 and 152 of the transistors 130 and 150.

The output terminal 104 or the collector region 176 of the PNP transistor 170 is also connected to the emitter region 122 of the feedback transistor 120. Thus a third stage amplifier including the transistors 160 and 170 has an output negatively feedback to the input terminal 102 through the emitter-to-collector circuit of the feedback transistor 120.

Figure 7:
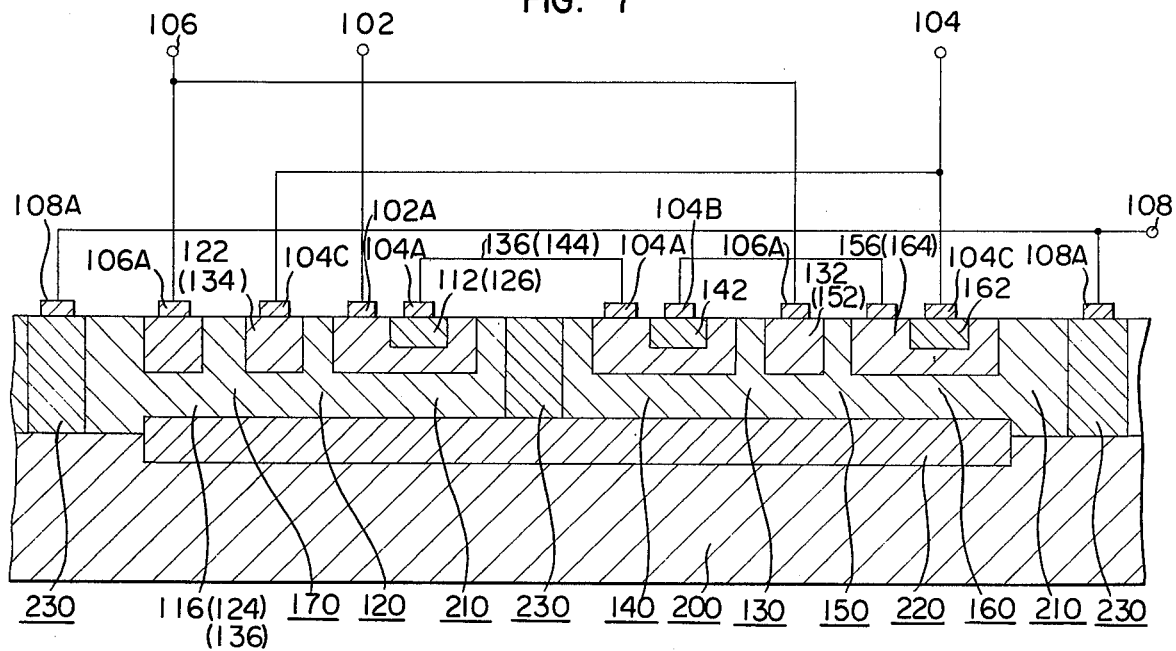
FIG. 7 is a fragmental sectional view of a structure of a semiconductor integrated circuit into which the equivalent circuit shown in FIG. 6 is constructed.

FIG. 7 shows a structure of a semicnductor integrated circuit into which the arrangement as shown in FIG. 6 is constructed in accordance with the IIL configuration. The arrangement illustrated is different from that shown in FIG. 5 in that in FIG. 7 the N type epitaxial layer 210 such as shown in FIG. 5 is divided into two portions by an intermediate N+ type embedded layer 220 and that three transistors are disposed in each of the divided epitaxial layers 210.

The lefthand portion as viewed in FIG. 7 of the N type epitaxial layer 210 is identical in structure to the N type epitaxial layer 210 as shown in FIG. 5 to include the longitudinal common emitter NPN transistor 110 serving as the input transistor and the lateral, common base PNP transistor 120 serving as the feedback transistor as well as the lateral common base PNP transistor 170 rather than the common base PNP transistor 130. The transistor 170 includes the emitter region 172 formed of the leftmost P type diffusion region 172, the base region 174 serving as both the collector region 126 of the transistor 120 and the emitter region 116 of the transistor 110 and the collector region 176 formed of the intermediate P type diffusion region also serving as the emitter region 122 of the transistor 120.

The righthand portion of the N type epitaxial layer 210 includes also three P type diffusion regions labelled 136(144), 132(152) and 156(164). The outermost diffusion regions 136(144) and 156(164) are provided with N+ type diffusion regions 142 and 162 to form the longitudinal, common emitter NPN transistors 140 and 160 respectively with the N type epitaxial layer 210. The intermediate region 132(154) forms the lateral, common base PNP transistor 130 and 150 with the adjacent P type diffusion regions and the epitaxial layer.

Then the input terminal 102 is connected to an electrode 102A disposed in ohmic contact with the P type diffusion regin 114(126) while the output terminal 104 is connected to both an electrode 104C disposed in ohmic contact with the P type diffusion region 122(176) and an electrode 104C disposed in ohmic contact with N+ type diffusion region 162. Electrode 104A disposed in ohmic contact with the N+ type diffusion region 112 and the P type diffusion region 136(144) respectively are interconnected and electrodes 104B disposed in ohmic contact with the N+ type diffusion region 142 and the P type diffustion region 132(144) respectively are interconnected. The injector terminal 106 is connected to electrodes 106A disposed in ohmic contact with the P type regions 122(176) and 132(152) respectively. As in the arrangement of FIG. 5 the ground terminal 108 is connected to electrodes 108A disposed in ohmic contact with the outermost N+ type diffusion regions 230.

If desired, any desired odd number of amplifier stages including an NPN and PNP transistor such as the transistors 110 and 130 may be connected in cascade with the last stage amplifier negatively feedback to the first stage amplifier through the feedback PNP transistor 120. The resulting linear amplifier circuit can be stably operated as long as the gain is properly shared among the amplifier stages. It will readily be understood that such a linear amplifier circuit can be constructed into a structure similar to that shown in FIG. 7.

While the present invention has been illustrated and described in conjunction with a few preferred embodiments thereof it is to be understood that numerous changes and modifications may be resorted to without departing from the spirit and scope of the present invention.

What we claim is:

1. A semiconductor integrated circuit having a composite structure comprising a longitudinal, common emitter NPN transistor including an emitter region and a base region common to a base region and a collector region of a lateral, common base PNP transistor respectively, and an input terminal connected to a P type region common to said base region of said NPN transistor and said collector region of said PNP transistor, said NPN transistor including a collector region connected to an output terminal wherein said PNP transistor includes an emitter region formed of another P type region, said another P type region also forming a collector region of a load, lateral, common base PNP transistor and connected to said output terminal, and said load, lateral, common base PNP transistor includes an emitter region connected to an injector terminal.

2. A semiconductor integrated circuit as claimed in claim 1 wherein said lateral common base PNP transistor is operative to negatively feed a variation in potential at said output terminal back to said input terminal to maintain the potential at said output terminal constant thereby to produce a linearly amplified output at said output terminal.

3. A semiconductor integrated circuit comprising an injector terminal, a load, common base PNP transistor including a collector region, and an emitter region connected to said injector terminal and responsive to carriers from said injector terminal injected into said emitter region to be conducting and operative as a source of constant current, an input, common emitter NPN transistor including a collector region common to said collector region of said load PNP transistor, a base region connected to an input terminal, and an emitter region, and a feedback, common base PNP transistor including a base region and a collector region common to said emitter and base regions of said input NPN transistor respectively to form an IIL configuration with said input NPN transistor, said feedback PNP transistor including an emitter region connected to an output terminal, said output terminal being also connected to said collector regions of said load and input transistors whereby an input signal applied to the input terminal is linearly amplified and developed at the output terminal.

4. A semiconductor integrated circuit as claimed in claim 3 wherein said load transistor has the collector region common to said emitter region of said feedback transistor.

5. A semiconductor integrated circuit as claimed in claim 3 wherein said circuit comprises a semiconductor substrate having a predetermined conductivity type, an N type semiconductor layer epitaxially grown upon said semiconductor substrate, a first, a second and a third P type diffusion region disposed in predetermined portions of said N type semiconductor layer to be spaced away from one another by predetermined distances, an N type diffusion region disposed in a predetermined portion of said first P type diffusion region, a ground terminal connected to said N type semiconductor layer, an input terminal connected to said first P type diffusion region, an output terminal connected to said N type diffusion region, and an injector terminal connected to said third P type region, whereby said N type semiconductor layer, said first P type diffusion region and said N type diffusion region form said input, longitudinal, common emitter NPN transistor, said second P type diffusion region, said N type semiconductor layer and said first P type region form said feedback, lateral, common base PNP transistor, and said third P type diffuston region, said N type semiconductor layer and said second P type diffusion form said load, lateral, common base PNP transistor.

6. A semiconductor integrated circuit as claimed in claim 5 wherein said semiconductor substrate has a P type conductivity and has an N type embedded layer with high impurity concentration disposed between the same and said N type epitaxially grown semiconductor layer.

7. A semiconductor integrated circuit as claimed in claim 6 wherein an N type semiconductor region with a high impurity concentration extends through a predetermined portion of said epitaxially grown N type semiconductor layer from the surface thereof until it reaches said P type semiconductor substrate, and an electrode to be connected to the ground terminal is disposed in ohmic contact with the surface of said high concentration N type semiconductor region.

8. An amplifier device including in combination,
a first NPN transistor having an input base electrode, a common emitter electrode and an output collector electrode,
a second PNP transistor having a collector electrode connected to said collector electrode of said first transistor and an emitter electrode adapted to be connected to a current supply, whereby said second transistor forms a load for said first transistor,
a third PNP transistor having an emitter electrode connected to said collector electrode of said first transistor and a collector electrode connected to said base electrode of said first transistor, and
means connecting said emitter electrode of said first transistor and said base electrodes of said second and third transistors to a reference potential.

9. A semiconductor device for providing gain including,
a body of N-type material and first, second and third spaced diffusions of P-type material in said body, said first and second diffusions cooperating with said N-type body to form a first PNP transistor, said second and third diffusions cooperating with said N-type body to form a second PNP transistor said N-type body forming the base electrodes of said first and second transistors,
a fourth N-type diffusion within said third P-type diffusion and cooperating with said N-type body and said third diffusion to form an NPN transistor, said body forming the emitter electrode of said NPN transistor,
said body being connected to ground to effectively ground the base electrodes of said first and second PNP transistor and the emitter electrode of said NPN transistor,
means for applying an input signal to said third diffusion which forms the base electrode of said NPN transistor, and means for deriving an output signal from said fourth N-type diffusion which forms the collector electrode of said NPN transistor, and
means for applying current to said first diffusion whereby said first PNP transistor forms a load for said NPN transistor, and means connecting said second diffusion to said fourth diffusion so that said second PNP transistor, provides bias for said NPN transistor.

* * * * *